(12) United States Patent
Cha

(10) Patent No.: US 11,690,188 B2
(45) Date of Patent: Jun. 27, 2023

(54) DISPLAY DEVICE

(71) Applicant: LG ELECTRONICS INC., Seoul (KR)

(72) Inventor: Taesung Cha, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 197 days.

(21) Appl. No.: 17/311,844

(22) PCT Filed: Dec. 11, 2018

(86) PCT No.: PCT/KR2018/015712
§ 371 (c)(1),
(2) Date: Jun. 8, 2021

(87) PCT Pub. No.: WO2020/122273
PCT Pub. Date: Jun. 18, 2020

(65) Prior Publication Data
US 2022/0022332 A1 Jan. 20, 2022

(51) Int. Cl.
*H05K 5/02* (2006.01)
*H05K 5/00* (2006.01)
(Continued)

(52) U.S. Cl.
CPC ......... *H05K 5/0234* (2013.01); *H05K 5/0017* (2013.01); *H05K 5/0247* (2013.01);
(Continued)

(58) Field of Classification Search
None
See application file for complete search history.

(56) References Cited

U.S. PATENT DOCUMENTS 5,729,310 A * 3/1998 Horiuchi ............. G02B 6/0088
349/64
6,229,584 B1 5/2001 Chuo et al.
(Continued)

FOREIGN PATENT DOCUMENTS

EP 3407597 11/2018
JP 2003079036 3/2003
(Continued)

OTHER PUBLICATIONS

European Patent Office Application Serial No. 18942959.0, Search Report dated Jul. 6, 2022, 9 pages.
(Continued)

*Primary Examiner* — Xanthia C Cunningham
(74) *Attorney, Agent, or Firm* — Lee, Hong, Degerman, Kang & Waimey PC

(57) ABSTRACT

The present embodiment comprises: a stand having a side plate provided with a cable receiving groove portion for receiving a cable; a cable bracket fastened to the stand and having a separation portion being spaced apart from the side surface of the cable receiving groove portion; and a cover body having a side cover that covers the side surface of the cable receiving groove portion and the cable bracket, and a rear cover that is bent from the side cover, wherein a through hole, through which the cable passes, is formed between the rear cover and the side plate, and a part of the cable is accommodated between the side surface and the separation portion of the cable receiving groove portion.

10 Claims, 13 Drawing Sheets

(51) Int. Cl.
 *H10K 50/84* (2023.01)
 *H10K 77/10* (2023.01)
 *H10K 102/00* (2023.01)
(52) U.S. Cl.
 CPC ........... *H10K 50/84* (2023.02); *H10K 77/111* (2023.02); *H10K 2102/311* (2023.02)

(56) References Cited

U.S. PATENT DOCUMENTS

| | | | | |
|---|---|---|---|---|
| 6,816,364 | B2* | 11/2004 | Helot | G06F 1/1601 248/920 |
| 7,712,946 | B2* | 5/2010 | Lee | G02F 1/13452 362/362 |
| 7,881,050 | B2* | 2/2011 | Johnson | F16M 11/2014 361/679.21 |
| 7,898,612 | B2* | 3/2011 | Ota | G02F 1/13476 349/150 |
| 2007/0084624 | A1 | 4/2007 | Martin et al. | |
| 2011/0164394 | A1* | 7/2011 | Hwang | H05K 5/0017 361/679.01 |
| 2014/0036199 | A1* | 2/2014 | Ka | H04N 5/645 29/428 |
| 2016/0050774 | A1* | 2/2016 | Merenda | H05K 5/0086 224/162 |
| 2016/0156118 | A1* | 6/2016 | Joo | H05K 5/0247 361/752 |
| 2016/0295713 | A1* | 10/2016 | Hwang | H05K 5/0247 |
| 2018/0110138 | A1* | 4/2018 | Oda | H04N 5/655 |
| 2019/0056058 | A1* | 2/2019 | Pell | F16M 11/04 |
| 2019/0309894 | A1* | 10/2019 | Hasegawa | H05K 5/0217 |

FOREIGN PATENT DOCUMENTS

| | | |
|---|---|---|
| KR | 1020050071922 | 7/2005 |
| KR | 100775022 | 11/2007 |
| KR | 1020090014431 | 2/2009 |
| KR | 200459492 | 3/2012 |

OTHER PUBLICATIONS

PCT International Application No. PCT/KR2018/015712, International Search Report dated Sep. 1, 2019, 4 pages.

* cited by examiner

[FIG. 1]
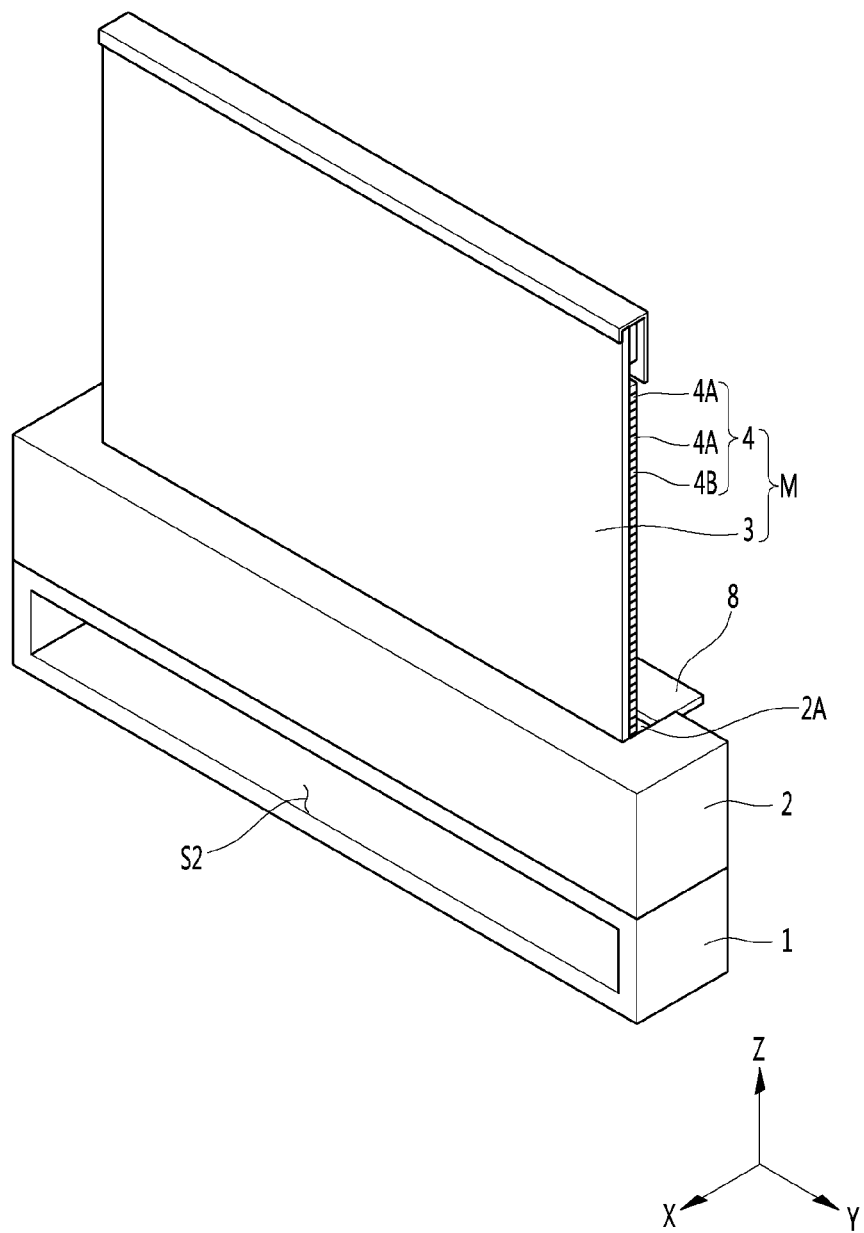

[FIG. 2]
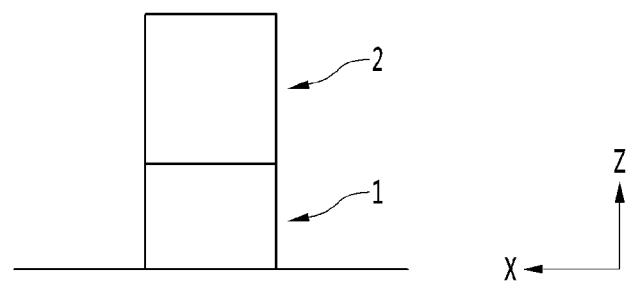
[FIG. 3]
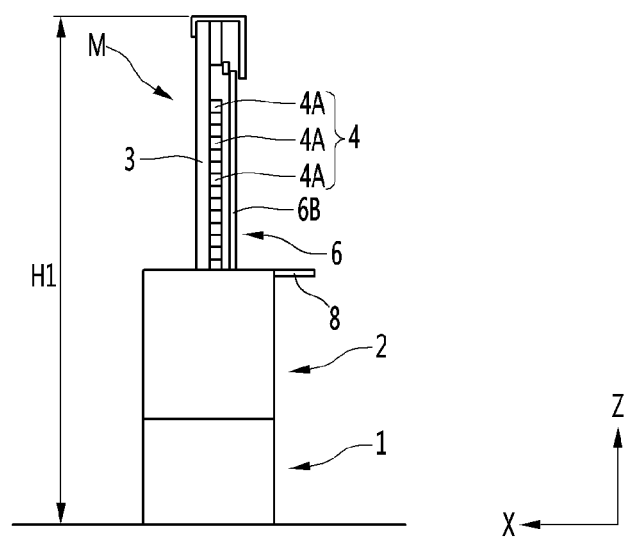

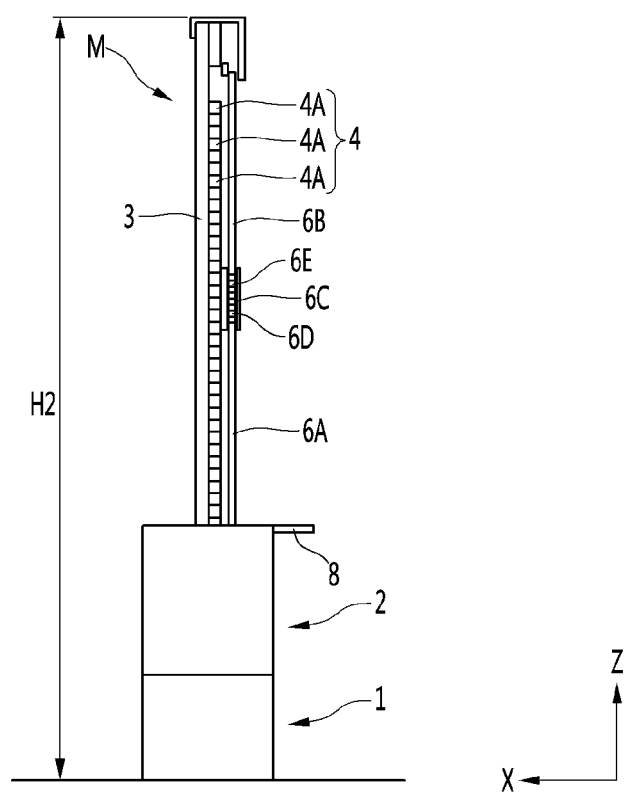
[FIG. 4]

[FIG. 5]
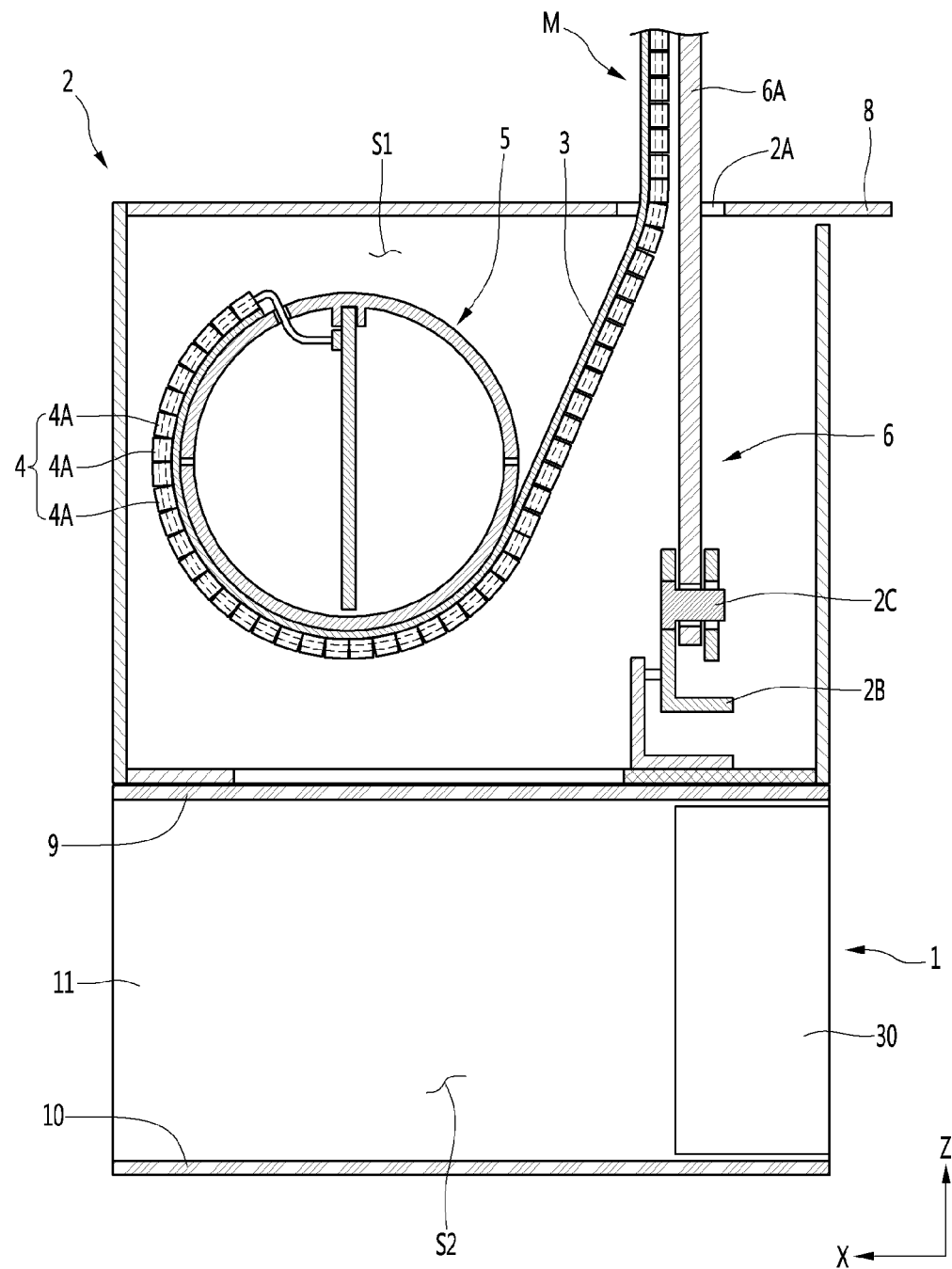

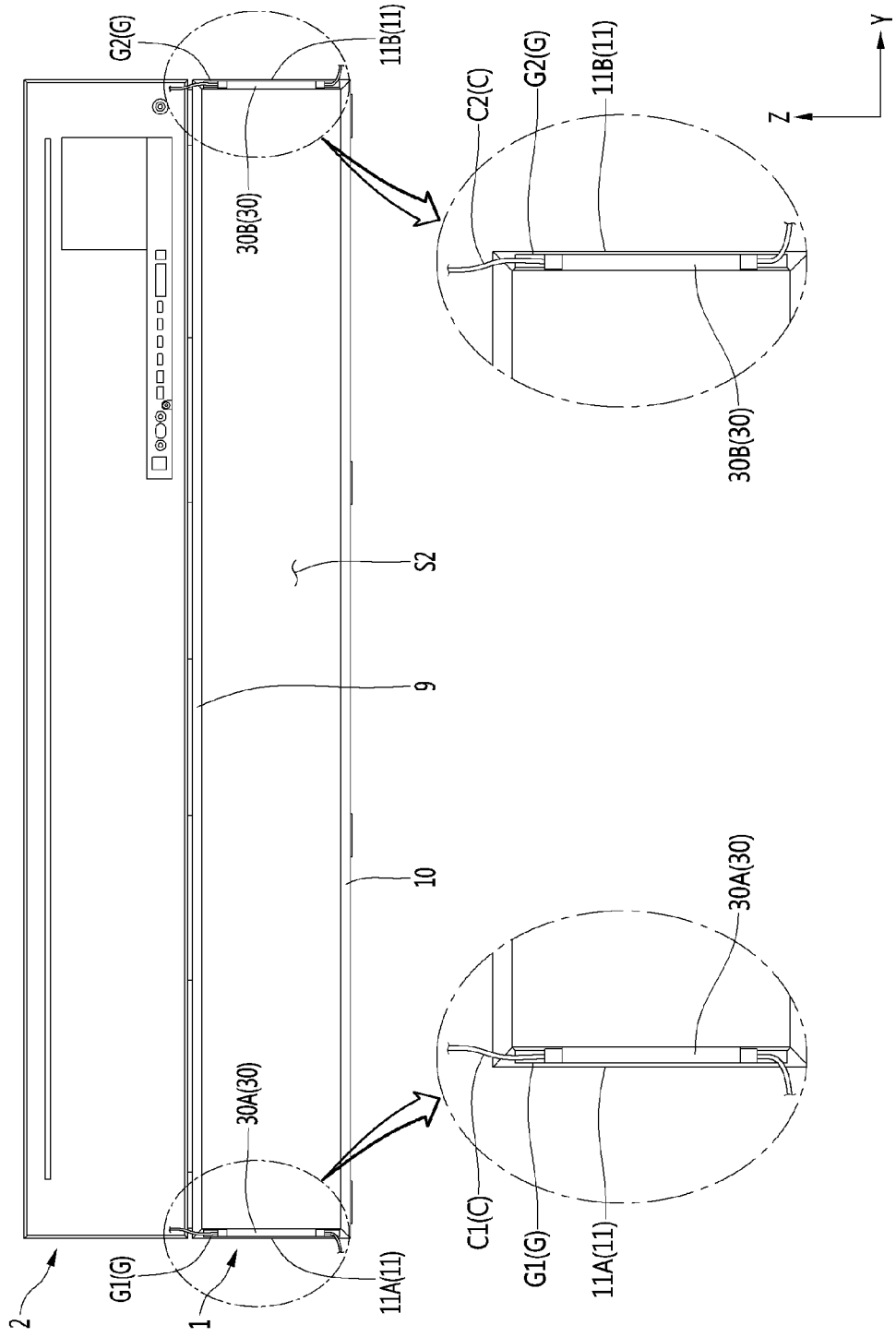

[FIG. 7]
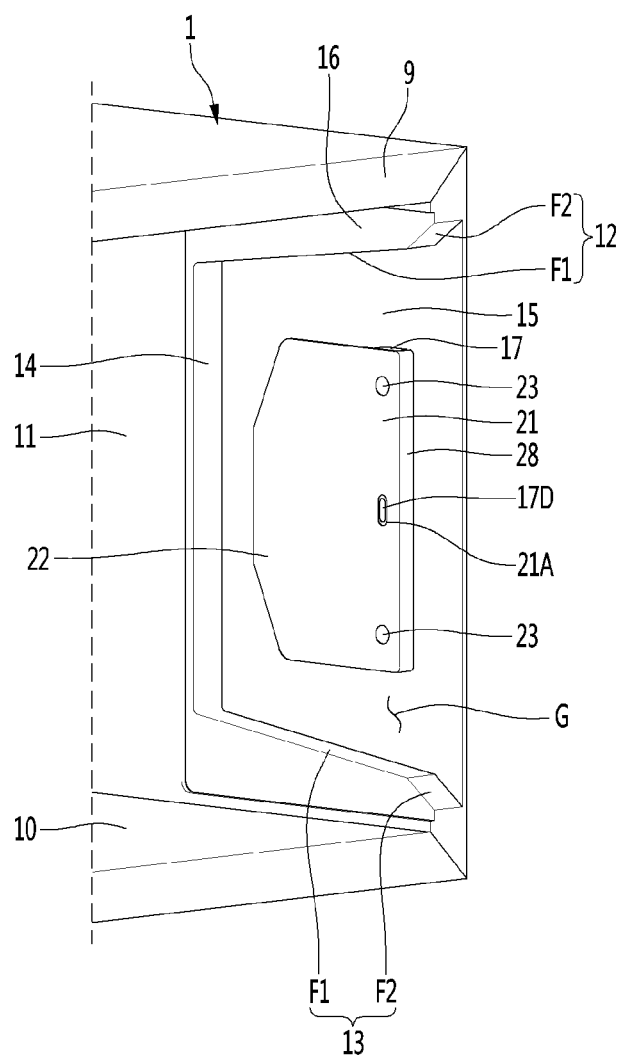

[FIG. 8]
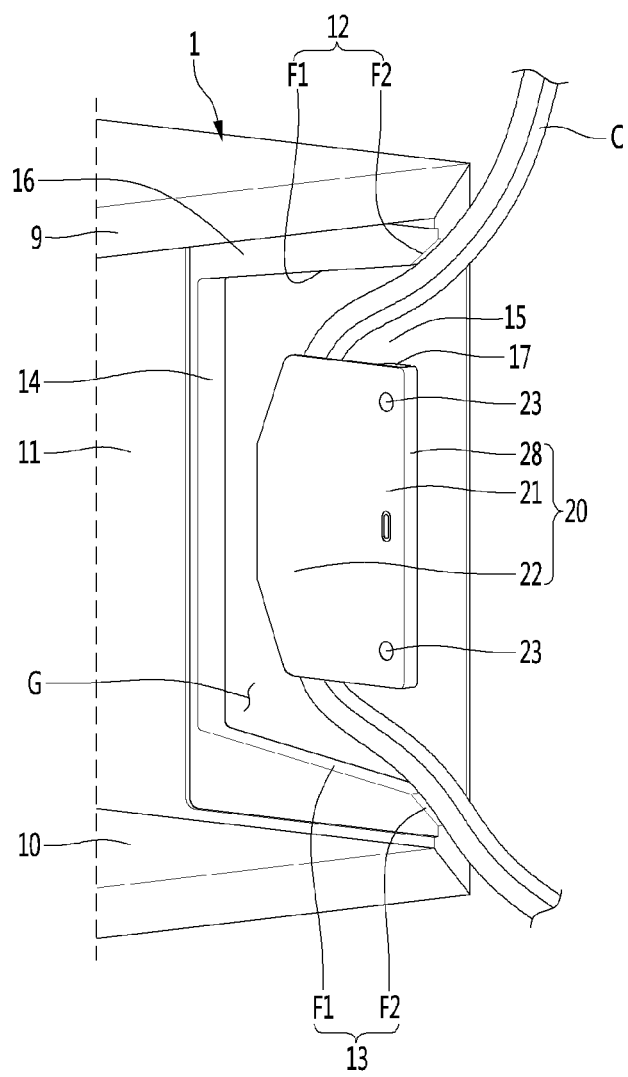

[FIG. 9]
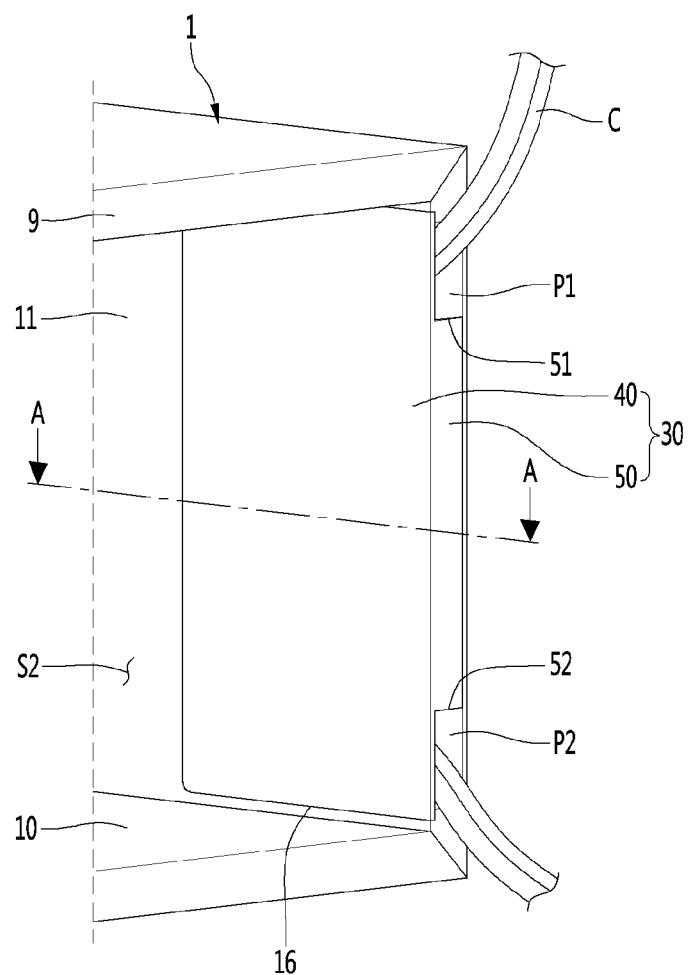

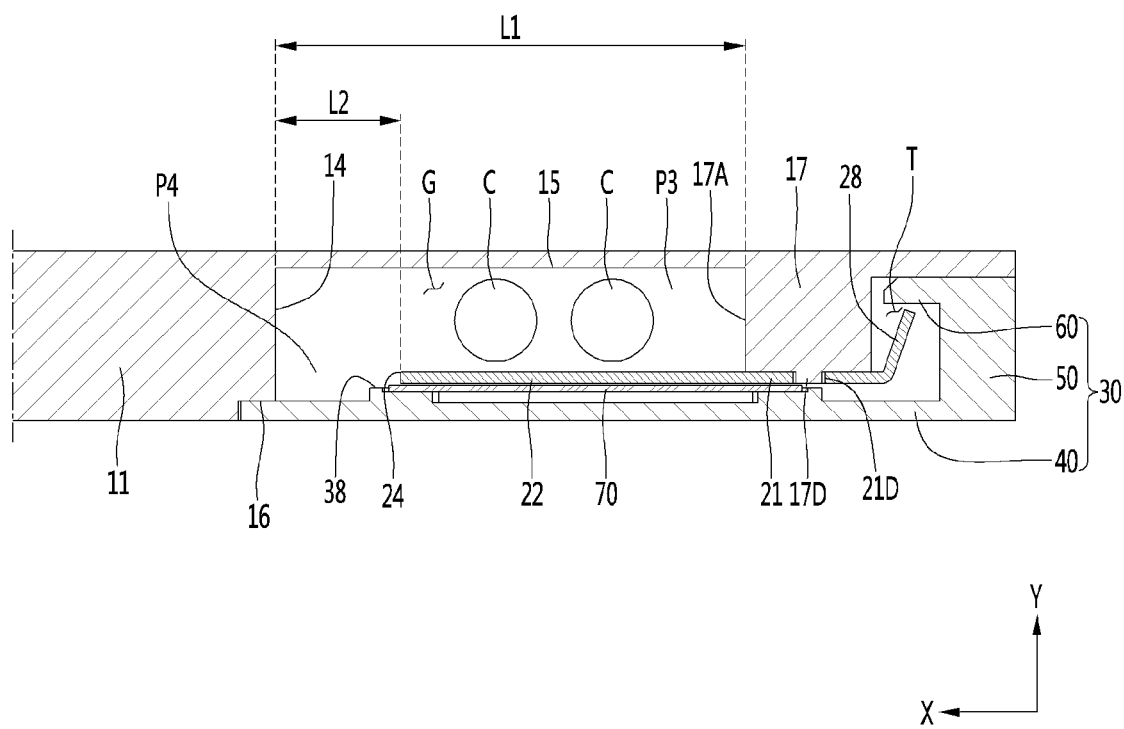
[FIG. 10]

[FIG. 11]
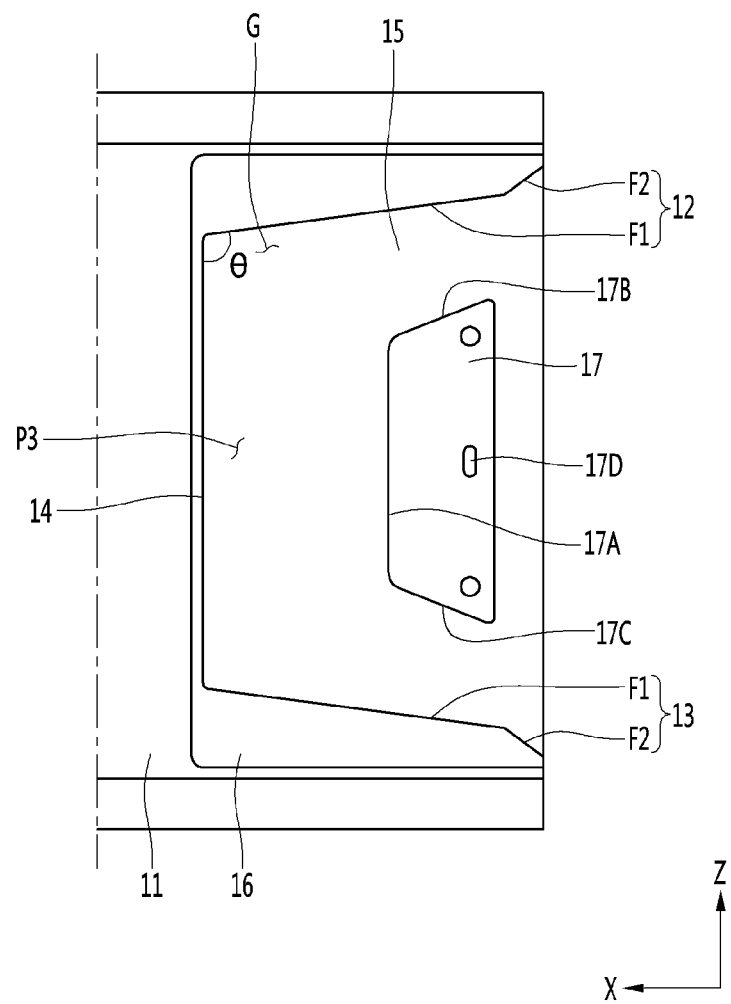

[FIG. 12]
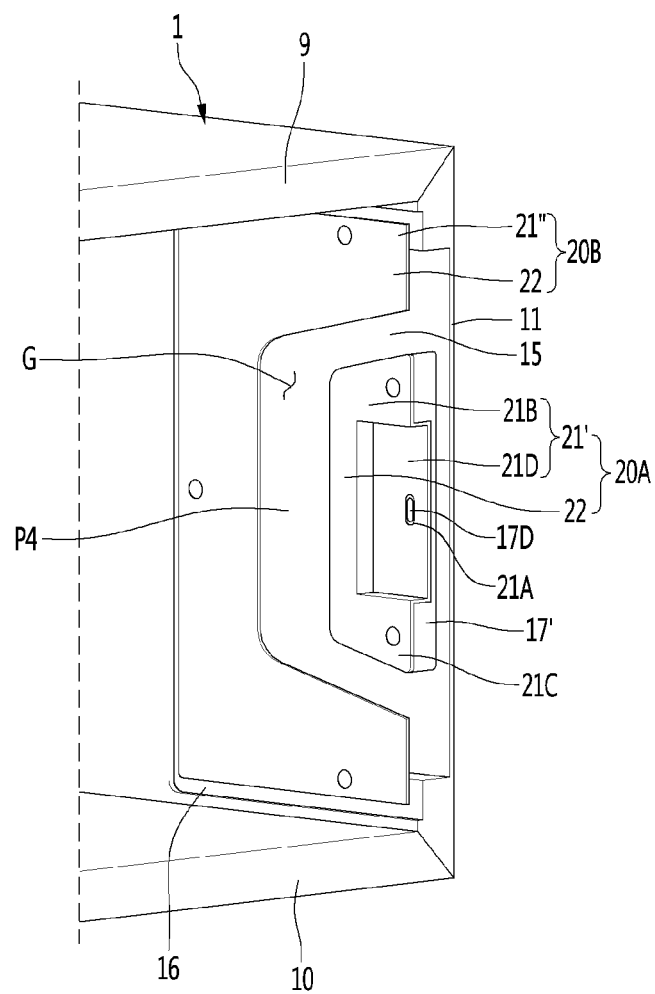

[FIG. 13]
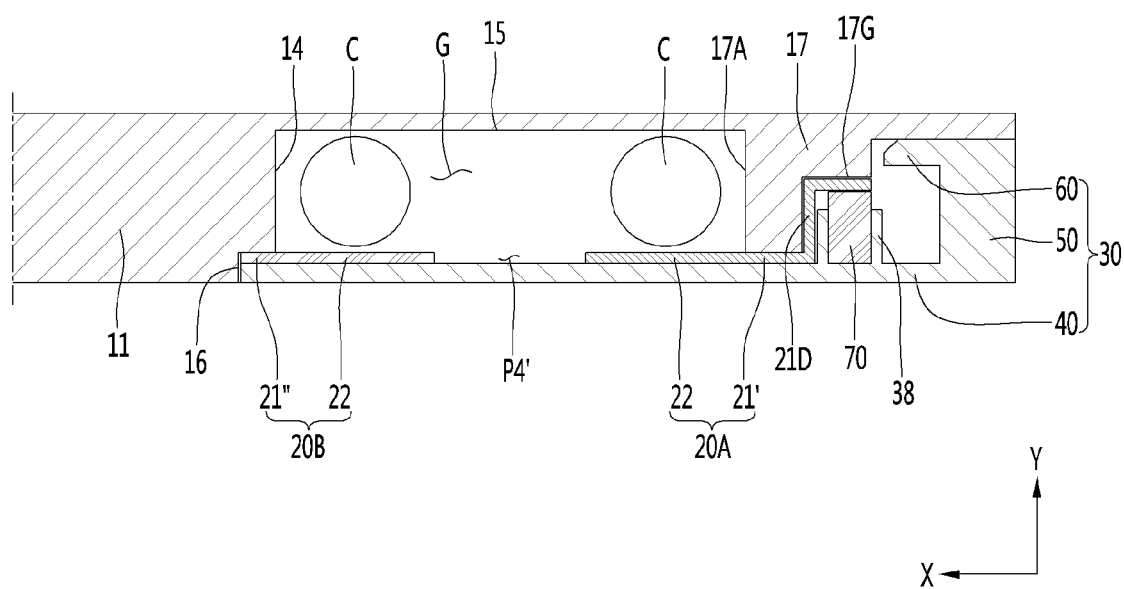

[FIG. 14]
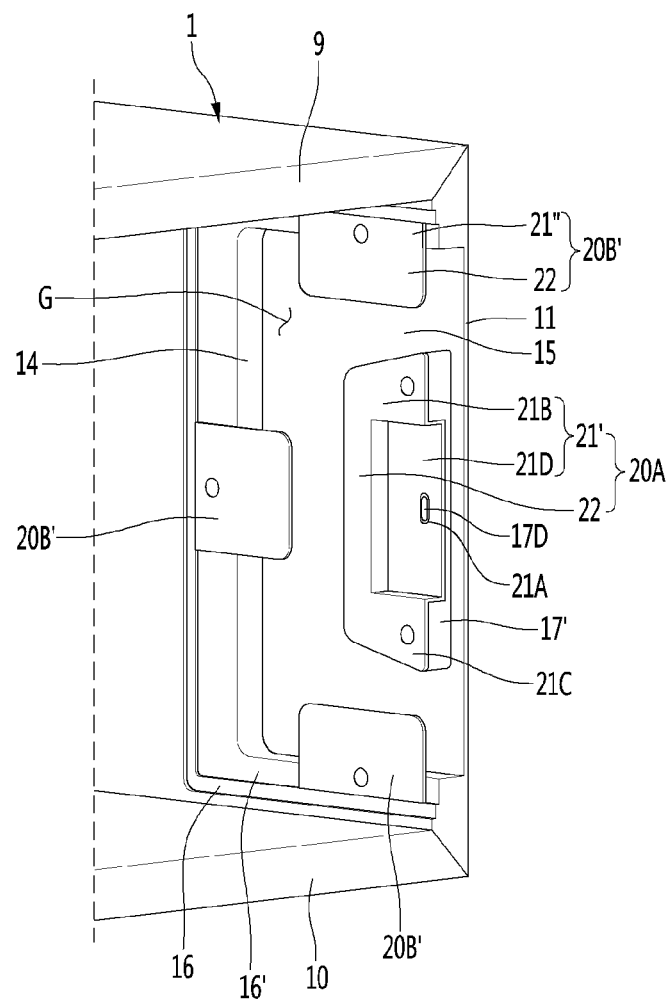

DISPLAY DEVICE

CROSS-REFERENCE TO RELATED APPLICATIONS

This application is the National Stage filing under 35 U.S.C. 371 of International Application No. PCT/KR2018/015712, filed on Dec. 11, 2018, the contents of which are hereby incorporated by reference herein its entirety.

TECHNICAL FIELD

The present disclosure relates to a display device.

BACKGROUND ART

As the information society develops, the demand for a display device is increasing in various forms. Studies and researches have been performed on various display devices, such as a liquid crystal display device (LCD), a plasma display panel (PDP), an electro luminescent display (ELD), an organic light emitting diode (OLED), a vacuum fluorescent display (VFD).

Among the display devices, a display device using an Organic Light Emitting Diode (OLED) represents excellent characteristics in brightness and a viewing angle, and does not require a backlight unit when compared with the LCD. Accordingly, the display device may be realized in an ultra-thin display type.

Such a display device may be classified into a stand-type display device and a wall-mounted display device depending on an installation manner thereof, and the stand-type display device may include a stand module that maintains a display panel at a predetermined height.

The stand module may simply support the display panel, or may not only support the display panel, but also store/protect cables connected to the display panel.

An example of a display device, in which a cable is received and protected by a stand module, is disclosed in Korean Unexamined Patent Publication No. 10-2006-0021075 A (published on Mar. 7, 2006), and such a display device may include a cable holder including a receiving part provided on a stand to receive a cable in a zigzag phase, and an entrance incision part for entrance of the cable, having a partial cylinder shape, and formed of a material, such as plastic, having elastic force, and a blocking member inserted into the entrance incision to connect opposite ends of the entrance incision to each other.

The display device disclosed in Korean Unexamined Patent Publication No. 10-2006-0021075 A (published on Mar. 7, 2006) may have a cable receiving space open up and down in the receiving part. In this case, foreign substances, such as dust or water, may be easily introduced into the cable receiving space through an upper portion or a lower portion of the cable receiving space, may contaminate an outer surface of the cable, or may damage the cable. In addition, the cable received in the cable receiving space may be easily viewed from the outside, so the surroundings of the display panel are not cleanly viewed.

DISCLOSURE

Technical Problem

An object of the present disclosure is to provide a display device capable of more reliable and cleanly protecting a cable and improving the appearance of itself.

Technical Solution

According to an embodiment, a display device includes a stand having a side plate including a cable receiving groove formed to receive a cable, a cable bracket fastened to the stand and having a spacing part spaced apart from a side surface of the cable receiving groove, a cover body including a side cover to cover the side surface of the cable receiving groove and the cable bracket, and a rear cover bent from the side cover, and a through hole formed between the rear cover and the side plate such that the cable passes through the through hole. A portion of the cable is received between the side surface of the cable receiving groove and the spacing part.

The stand and the cover body may be non-magnetic members, the cable bracket may be a magnetic member, and a magnet attached to the cable bracket may be coupled to the cover body.

The cable receiving groove may include a top surface and a bottom surface spaced apart from each other in a vertical direction, an upper end of the rear cover may be spaced apart from the top surface, and a lower end of the rear cover may be spaced apart from the bottom surface.

The stand may include a side cover receiving groove which is formed at a peripheral portion of the cable receiving groove and receives a portion of the side cover.

The cable receiving groove may further include a front surface to link a front end of the top surface to a front end of the bottom surface, and a protruding part spaced apart from the front surface in a front-rear direction may be formed in the cable receiving groove.

Each of the top surface and the bottom surface may include a first inclined surface having an obtuse angle with respect to the front surface, and a second inclined surface extending from the first inclined surface and is steeper than the first inclined surface.

A top surface of the protruding part and a bottom surface of the protruding part may be gradually become closer to each other toward a forward direction.

In addition, the cable bracket may be fastened to the protruding part, a front end of the protruding part and the front surface of the cable receiving groove may be spaced apart from each other by a first distance, and a front end of the cable bracket and the front surface of the cable receiving groove are spaced apart from each other by a second distance shorter than the first distance.

In addition, the rear cover may be spaced apart from the protruding part in the front-rear direction, and an inner cover, which has a length sorter than a length of the side cover in the front-rear direction, may protrude toward the protruding part in the rear cover, and a bending part may be formed in the cable bracket such that the bending part is surrounded by the side cover, the rear cover, the inner cover, and the protruding part.

The stand may include a pair of side plates spaced apart from each other in a left-right direction, and the cable receiving groove may be formed in an inner side surface of at least one of the pair of side plates, in which the inner side surface faces a remaining one of the pair of side plates.

Advantageous Effects

According to an embodiment of the present disclosure, since the cover body, which is the non-magnetic member, may be simply attached or detached through the magnet, the cover body may be easily attached or detached, and the cable may be easily received or withdrawn.

In addition, the through hole for allowing the cable to pass therethrough may include the upper through hole formed between the upper end of the rear cover and the top surface of the cable receiving groove, and the lower through hole formed between the lower end of the rear cover and the bottom surface of the cable receiving groove. A portion, which passing through the upper through hole, of the cable and a portion, which passes through the lower through hole, of the cable may be received in the cable receiving groove and, in this state, be concealed and protected, with higher reliability, between the side plate, the cable bracket, and the side cover.

In addition, a portion of the side cover is received in the side cover receiving groove formed in the side plate, thereby minimizing that the side cover protrudes toward the side of the side plate, and protecting the side cover by the side plate.

In addition, the cable may be confined by the protruding part, may be prevented from being arbitrarily released in a rear direction, and may be maintained in the cable receiving groove.

In addition, the cable may be bent gently as much as possible by the first inclined surface and the second inclined surface of each of the top surface and the bottom surface, to be prevented from erroneously operating, due to the damage to the cable that may be caused when the cable is sharply bent.

In addition, the protruding part may be formed in the shape that the top surface of the protruding part and the bottom surface of the protruding part are gradually become closer to each other toward the forward direction. Accordingly, a portion, which is positioned in the cable receiving groove, of the cable may be bent gently as much as possible.

In addition, the cable may be easily introduced into the space between the side surface of the cable receiving groove and the spacing part of the cable bracket, through the space between the front end of the cable bracket and the front surface of the cable receiving groove, and it may be minimized that the cable is arbitrarily released out of the cable receiving groove.

In addition, even if the cover body is pushed to the side by the spacing part, as the cable and the spacing part are shaken, since the inner cover of the cover body is restricted by the bending part, the cover body may be maintained attached without being released in a side direction. Accordingly, the cover body may be maintained with higher reliability.

In addition, since the cover body is positioned inside the stand and at the rear end of the stand, the space between the stand and the cover body is not viewed from the outside and the introduction of water or foreign substances, such as dust, into the space between the stand and the cover by may be minimized.

DESCRIPTION OF DRAWINGS

FIG. 1 is a perspective view of a display device according to an embodiment of the present disclosure;

FIG. 2 is a side view of a display device, when the display module is hidden in a housing according to an embodiment of the present disclosure;

FIG. 3 is a side view of a display device, when a portion of the display module is lifted in the housing illustrated in FIG. 2;

FIG. 4 is a side view of a display device, when the display module according to an embodiment of the present disclosure is raised to a maximum elevation height;

FIG. 5 is a cross-sectional view of a display device illustrating a housing and a stand according to an embodiment of the present disclosure;

FIG. 6 is a rear view of a of a display device according to an embodiment of the present disclosure;

FIG. 7 is a perspective view when a cable bracket is fastened to a side plate according to an embodiment of the present disclosure;

FIG. 8 is a perspective view when a cable is caught in the cable bracket illustrated in FIG. 7;

FIG. 9 is a perspective view when the cable bracket illustrated in FIG. 8 is covered by a cover body;

FIG. 10 is a cross-sectional view taken along line A-A illustrated in FIG. 9;

FIG. 11 is a side view illustrating a cable receiving groove and a protrusion according to an embodiment of the present disclosure;

FIG. 12 is a perspective view when a cable bracket is fastened to a side plate and a cover body is separated according to another embodiment of the present disclosure;

FIG. 13 is a cross-sectional view when a cable bracket is fastened to a side plate and a cover body is attached to the cable bracket according to another embodiment of the present disclosure; and FIG. 14 is a perspective view when a cable bracket is fastened to a side plate and a cover body is separated according to another embodiment of the present disclosure.

BEST MODE

Mode for Invention

Hereinafter, detailed embodiments of the present disclosure will be described in detail with reference to the drawings.

FIG. 1 is a perspective view of a display device according to an embodiment of the present disclosure, FIG. 2 is a side view of a display device, when the display module is hidden in a housing according to an embodiment of the present disclosure, FIG. 3 is a side view of a display device, when a portion of the display module is lifted in the housing illustrated in FIG. 2, FIG. 4 is a side view of a display device, when the display module according to an embodiment of the present disclosure is raised to a maximum elevation height, and FIG. 5 is a cross-sectional view of a display device illustrating a housing and a stand according to an embodiment of the present disclosure.

The display device may include a stand 1. The display device may further include a housing 2 and a display module M, and the display module M may include a display panel 3 and a display cover 4.

The stand 1 may be formed in a hexahedral shape as a whole, and may have a hexahedral shape that longitudinally extends in left-right directions. The housing 2 may be disposed on the stand 1, and the stand 1 may support the housing 2 and the display module.

The display module M may move down toward the housing 2 or may move up from the housing 2. The display device may further include a roller 5 to which the display module M is connected. The display module M may be wound around the roller 5 or released from the roller 5. The roller 5 may be disposed inside the housing 2.

The housing 2 may include a combination of a plurality of members. The housing 2 may be formed therein with a space S1 to receive the roller 5. When the display module M moves down, the display module M may be received in the space 2 together with the rollers 5.

The display device may further include a lift module 6 that lifts or moves down the display module M. The lift module 6 may be coupled to the display module. The lift module 6 may be coupled to an upper portion of the display module M. In addition, a lower portion of the display module M may be coupled to the roller 5.

A lower portion of the lift module 6 may be disposed in the space S1 and an upper portion of the lift module 6 is coupled to the display module M.

The display module M may be lifted or wound around the roller 5 while being unfolded upward by the lift module 6, in the state that the display module M is coupled the roller 5 and the lift module 6.

Meanwhile, the housing 2 may be formed therein with an opening 2A to pass the display module 2 and the lead module 6. The opening 2A may be formed in an upper portion of the housing 2. The opening 2A may be formed to be open in a vertical direction Z at the upper portion of the housing 2.

The display module M may be wound around the roller 5 such that the entire of the display module M may be received in the space S1, and at least a portion of the display module M may be unfolded from the roller 5 and move upward of the space S1.

An entire portion of the display module M may be inserted and received into the housing 2 as illustrated in FIG. 2, and only a portion of the display module M may be lifted to a specific height H1 above a top surface of the housing 2 as illustrated in FIG. 3, and may be lifted up to the maximum height H2 as illustrated in FIG. 4.

It is preferable that the display panel 3 has elasticity to be bent or rolled, like an OLED, and in this case, the display panel 3 may be a flexible display panel.

The display panel 3 may display an image through a front surface thereof, and an area of the display panel 3 exposed above the housing 1 may be an active area in which an image may be viewed from the outside, and an area of the display panel 3 positioned in the space S1 of the housing 1 may be an inactive area in which an image may not be viewed from the outside.

The display cover 4 may be disposed on a rear surface of the display panel 3 and may cover the rear surface of the display panel 3. The display cover 4 may be a panel supporter to support the display panel 3.

The display cover 4 may include a plurality of supporters 4A to support the display panel 3. Each of the plurality of supporters 4A may be longitudinally disposed in a horizontal direction along the rear surface of the display panel 3.

The plurality of supporters 4A may be attached to the rear surface of the display panel 3. The display module may further include an adhesive member to fix the plurality of supporters 4A to the display panel 3.

The plurality of supporters 4A may be attached to the rear surface of the display panel 3 by the adhesive member. The adhesive member may be fixed to the rear surface of the display panel 3 and a front surface of the supporter 4A.

The adhesive member may include a double-sided tape, or may include an adhesive interposed between the display panel 3 and the supporter 4A. The adhesive member may be attached to the rear surface of the display panel 3, and a plurality of supporters 4A may be attached to the rear surface of the adhesive member 42 in the horizontal direction to support the display panel 3 and the adhesive member.

When the display panel 3 is in an upright status, the plurality of supporters 4A may be arranged to be stacked in the vertical direction Z, and an upper end of the supporter, which is positioned at a lower position, of the plurality of supporters 4A may make contact with a lower end of another supporter positioned the support, and may support the another supporter positioned on the support positioned at the lower position.

When the display panel 3 is wound around the roller 5, a gap between the plurality of supporters 4A may be spread, and the plurality of supporters 4A may be wound around the roller 5 together with the display panel 3 and an adhesive member, in the state that the plurality of supporters 4A are attached to the display panel 3 by the adhesive member.

The lift module 6 may include a first arm 6A, a second arm 6B, and an arm joint 6C.

The first arm 6A may be rotatably coupled to an arm supporter 2B, which is installed in the housing 1 through a pin 2C.

The second arm 6B may be coupled to the upper portion of the display module M.

Each of the first arm 6A and the second arm 6B is rotatably coupled to the arm joint 6C. A driving gear 6D may be formed on the first arm 6A, and a driven gear 6E may be formed on the second arm 6B. The driven gear 6E is toothed with the driving gear 6D and may be rotated by the driving gear 6D when the driving gear 6D rotates.

The first arm 6A, the second arm 6B, and the arm joint 6C may constitute a link assembly, and such a link assembly may be linked to a rotating mechanism to move up and down the display module M.

The rotating mechanism may be installed inside the housing 1 and coupled to the second arm 6B to rotate the second arm 6B. The rotating mechanism may include a driving source such as a motor, and at least one power transmission member, such as a link, that transmits the driving force of the driving source to the first arm 6A to rotate the first arm 6A.

The display device may further include a door 8 that opens and closes the opening 2A. The door 8 may reciprocate in the front-rear direction to open and close the opening 2A, and may rotate in the vertical direction to open and close the opening 2A.

FIG. 6 is a rear view of a display device according to an embodiment of the present disclosure, FIG. 7 is a perspective view when a cable bracket is fastened to a side plate according to an embodiment of the present disclosure, FIG. 8 is a perspective view when a cable is caught in the cable bracket illustrated in FIG. 7, FIG. 9 is a perspective view when the cable bracket illustrated in FIG. 8 is covered by a cover body, FIG. 10 is a cross-sectional view taken along line A-A illustrated in FIG. 9, and FIG. 11 is a side view illustrating a cable receiving groove and a protrusion according to an embodiment of the present disclosure.

The display device may further include a cable bracket 20 and a cover body 30.

The stand 1 may constitute a stand module together with the cable bracket 20 and the cover body 30, and such a stand module may be arranged on the stand 1, to support, for example, the housing or the display panel.

The stand 1 may be provided separately from the housing 2 and may be combined with the housing 2, and may be formed integrally with at the lower portion of the housing 2.

The stand module may conceal and protect at least one cable C connected to the display device.

Hereinafter, each component of the stand module will be described.

The stand 1 may include an upper stand 9 and a lower stand 10. The stand 1 may include at least one side plate to connect the upper stand 9 to the lower stand 10.

The stand 1 may include a pair of side plates 11A and 11B.

The upper stand 9 may be formed to connect upper portions of the pair of side plates 11A and 11B to each other. The upper stand 9 may have a plate shape, and the upper stand 9 may form a top surface of the stand 1.

The lower stand 10 may have a plate shape, and the lower stand 10 may form a bottom surface of the stand 1.

The pair of side plates 11A and 11B may be spaced apart in a left-right direction Y. An empty space S2 may be formed between the pair of side plates 11A and 11B.

The empty space S2 may be a space that is not visible from left or right sides of the display device, and will be referred to as a stand space hereinafter.

In addition, the stand space S2 may be a space through, which a portion of the cable C passes before entering between the cable bracket 20 and the side plate 11. The stand space S2 may be a space positioned before the cover body 30 is attached to the cable bracket 20. The stand space S2 may be a space through which the cable C passes when withdrawn out of the stand module.

The left side surface of the left side plate 11A positioned on the left of the pair of side plates 11A and 11B may form a left appearance of the stand, and the right side surface of the pair of side plates 11A and 11B may form a right appearance of the stand. The right side surface of the left plate 11A may be an inner side surface facing the right side plate 11B in the left-right direction Y, and the left side surface of the right side plate 11B is an inner side facing the left side plate 11A in the left-right direction Y.

The side plates 11A and 11B may have a cable receiving groove formed therein to receive the cable.

The cable receiving groove may be formed in an inner side surface of at least one of the pair of side plates 11A and 11B, in which the inner side surface faces a remaining one of the pair of side plates 11A and 11B.

When the cable receiving groove is formed in each of the pair of side plates 11A and 11B, a left cable receiving groove G1 may be formed in the right side surface, which is the inner side surface of the left plate 11A, and a right cable receiving groove G2 may be formed in the left side surface which is the inner side surface of the right plate 11B.

A plurality of display cables may be received in the stand module, at least one first cable C1 may be received in the left cable receiving groove G1, and at least one second cable C2 may be received in the right cable receiving groove G2.

The first cable C1 and the second cable G2 may be different types of cables. For example, when the first cable C1 may be a power cable (or power cord), and the second cable C2 may be a data cable or a communication cable.

When both the left cable receiving groove G1 and the right cable receiving groove G2 are formed in the display device as described above, the display device include a left cable bracket coupled to the left plate 11A, and a left cover body 30A disposed on the left plate 11A, and may include a right cable bracket coupled to the right plate 11A and a right cover body 30A disposed on the right plate 11B.

The stand module may have a left and right symmetrical structure. Hereinafter, for convenience of explanation, the left side plate 11A and the right side plate 11B will be collectively referred to as the side plate 11, and the left cable receiving groove G1 and the right cable receiving groove G2 are collectively referred to as a cable receiving groove G, the first cable C1 and the second cable C2 are collectively referred to as a cable C, the left bracket and the right cable bracket will be collectively referred to as a cable bracket 20, and the left cover body 30A and the right cover body 30B will be collectively referred to as a cover body 30.

The stand 1 may include a non-magnetic member, such as aluminum, and may be formed of aluminum to realize a high-quality outer appearance.

The cable receiving groove G may be formed in a shape recessed in the inner side surface of the side plate 11. The cable receiving groove G may face the stand space S2 formed between the pair of side plates in the left-right direction Y.

The cable receiving groove G may include a top surface 12 and a bottom surface 13 spaced apart from each other in the vertical direction Z. The cable receiving groove G may include a front surface 14 connecting the front end of the top surface 12 and the bottom surface 13. The cable receiving groove G may include a side surface 15 connecting the top surface 12, the bottom surface 13, and the front surface 14.

Each of the top surface 12 and the bottom surface 13 of the cable receiving groove G may include a first inclined surface F1 having an obtuse angle θ with respect to the front surface 14 of the cable receiving groove G, and a second inclined surface F2 extending from the first inclined surface F1 and steeper than the first inclined surface F1.

The first inclined surface F1 may be an inclined surface close to a horizontal plane, and the second inclined surface F2 may be an inclined surface closer to a vertical plane when compared to the first inclined surface F1.

The stand 1 may have a side cover receiving groove 16 to receive a portion of the side cover 40. The side cover 16 may be formed at a peripheral portion of the cable receiving groove G. The side cover receiving groove 16 may be depressed stepwise from the inner side surface of the side plate 11. In addition, the cable receiving groove G may be formed stepped in the side cover receiving groove 16.

The depth, at which the side cover receiving groove 16 is recessed, may be equal to the thickness of the side cover 40, and a peripheral portion, which is positioned between the outer surface of the side cover 40 and the inner surface of the side plate 11, may be uniform in the front-rear direction Z and the vertical direction Z.

When the side cover 40 is attached to the cable bracket 20, the entire portion of the side cover 40 may be received in the side cover receiving groove 16. In this case, the side cover 40 does not protrude laterally from the side of the inner side surface of the side plate 11, such that the unified outer appearance of the side cover 40 and the side plate 11 may be provided.

The stand 1 may further include the protruding part 17 spaced apart from the front surface 14 of the cable receiving groove Gin the front-rear direction.

The protruding part 17 may be formed in the cable receiving groove G, the protruding part 17 may be smaller in size than the cable receiving groove G, and may protrude laterally from the side surface 14 of the cable receiving groove G.

The protruding part 17 may be spaced apart from each of the top surface 12, the bottom surface 13, and the front surface 14 of the cable receiving groove G.

The protruding part 17 may prevent the cable C received in the cable receiving groove G from being arbitrarily drawn in the rear direction of the cable receiving groove G. The protruding part 17 may be a stopper that is caught when the cable C is moved in the rear direction.

The front end 17A of the protruding part 17 and the front surface 14 of the cable receiving groove G may be spaced apart by a first distance L1. A gap (P3; see FIGS. 10 and 11) to receive a portion of the cable C may be formed between the front end 17A of the protruding part 17 and the front surface 14 of the cable receiving groove G.

The portion, which is received in the cable receiving groove G, of the cable C may be positioned in the gap P3 between the front surface 14 of the cable receiving groove G and the front end 17A of the protruding part 17.

Meanwhile, the top surface 17B of the protruding part 17 and the bottom surface 17C of the protruding part 17 may be formed to be gradually closer to each other toward a forward direction.

When the cable C is received in the stand module, the cable C is preferably bent in a curve shape formed gently as much as possible, and each of the top surface 17B of the protruding part 17 and the bottom surface 17C of the protruding part 17 may help bend the cable C in the shape curved as much as possible.

The cable bracket 20 may be fastened to the stand 1. The cable bracket 20 may include a fastening part 21 and a spacing part 22.

The fastening part 21 may be a part of the cable bracket 20 that is fastened to the stand 1 and may be a part of the cable bracket 20.

The cable bracket 20 may further include a bending part 28 to be described later. The bending part 28 may be bent at the fastening part 21, and in this case, the fastening part 21 may be interposed between the spacing part 22 and the bending part 28.

The spacing part 22 may be a part, which is spaced apart from the side surface 15 of the cable receiving groove G, of the cable bracket 20, and a portion of the cable C may be interposed between the side surface 15 of the cable receiving groove G and the spacing part 22. The spacing part 22 may be a cable holder that substantially supports the cable C together with the side plate 11.

A part of the cable C may be protected by the side plate 11 and the spacing part 22, between the side plate 11 and the spacing part 22.

The cable bracket 20 may include a first plate body and a second plate body that is smaller than the first plate body and bent from the first plate body.

A portion, which makes contact with the side plate 11, of the first plate body may be defined as the fastening part 21, and a portion, which is spaced apart from the side plate 11, of the first plate body may be defined as the spacing part 22. In addition, the second plate body may be the bending part 28.

The cable bracket 20 may be fastened to the protruding part 17. The fastening part 21 may be fastened with the protruding part 17. The fastening part 21 may be coupled to the protruding part 17 before the cable C is received, and the cable C may be introduced between the side surface 15 of the side plate 11 and the spacing part 22 in the state that the fasting part 21 is fastened to the protruding part 17.

A protrusion 17D may be formed in any one of the fastening part 21 and the protruding part 17, and a fitting hole 21A may be formed in another one of the fastening part 21 and the protruding part 17 such that the protrusion 17D is fitted into the fitting hole 21A. The cable bracket 20 may be fastened to the side plate 11, in particular, the fastening part 17, as the protrusion 17D is fitted into the fitting hole 21A.

Meanwhile, a fastening hole may be formed in each of the fastening part 21 and the protruding part 17, and the fastening part 21 may be fastened to the protruding part 17 by a fastening member 23, such as, a screw.

When the fastening part 21 is fastened to the protruding part 17, the front end 24 of the cable bracket 20, that is, the front end 24 of the spacing part 22 may be a free end spaced from the front surface 14 of the cable receiving groove G and the protruding part 17.

The front end 24 of the cable bracket 20 and the front surface 14 of the cable receiving groove G may be spaced apart from each other by a second distance L2 shorter than the first distance PL1. A gap P4 may be formed between the front end 24 of the cable bracket 20 and the front surface 14 of the cable receiving groove G such that the cable C is introduced from the side of the side plate 11. The length of the gap P4 in the front-rear direction may be slightly greater than the thickness of the cable C or may be equal to the thickness of the cable C.

The length of the gap P4 in the front-rear direction is preferably formed to minimize that the cable C is arbitrarily released, and may have a length between 1 and 2 times the thickness of the cable C.

The cover body 30 may have the same material as the stand 1 for high quality. The cover body 30 may have the same color as the stand 1. When the stand 1 is formed of aluminum, the cover body 30 may also be formed of aluminum.

The cover body 30 may include a side cover 40 and a rear cover 50.

The side cover 40 may cover the side surface 15 and the cable bracket 20 of the cable receiving groove G. The side cover 40 may cover the cable receiving groove G and the cable bracket 20 such that the cable receiving groove G and the cable bracket 20 are not viewed through the stand space S2 between the pair of side plates.

The length of the rear cover 50 in the vertical direction Z may be shorter than the length of the side cover 40 in the vertical direction Z. Through holes P1 and P2 may be formed between the rear cover 50 and the side plate 11 such that a cable passes through the through holes P1 and P2. The through holes P1 and P2 may be formed to be open in the front and rear direction, and the through holes P1 and P2 may communicate with the cable receiving groove G.

At least one pair of these through holes P1 and P2 may be formed, and for example, an upper through hole P1 (see FIG. 9) and a lower through hole P2 (see FIG. 9) may be formed.

In more detail, the upper end 51 of the rear cover 50 may be spaced apart from the top surface 12 of the cable receiving groove G. An upper through hole P1 may be formed between the upper end 51 of the rear cover 50 and the top surface 12 of the cable receiving groove G such that the cable C passes through the upper through hole P1.

In addition, the lower end 52 of the rear cover 50 may be spaced apart from the bottom surface 13 of the cable receiving groove G. A lower through hole P2 may be formed between the lower end 52 of the rear cover 50 and the bottom surface 13 of the cable receiving groove G such that the cable C passes through the lower through hole P2.

The cable C may be disposed to pass through the upper through hole P1 and the lower through hole (P2) when a portion of the cable C is received in the cable receiving groove G. In addition, a portion, which is interposed between the upper through hole P1 and the lower through hole P2, of the cable C may be concealed and protected by the stand 1, the cable bracket 20, and the cover body 30.

It is preferable that the rear cover 50 covers the protruding part 17 such that the protruding part 17 is not viewed from the rear of the stand. The rear cover 50 may have a plate shape, one end of the rear cover 50 may be connected with the rear end of the side cover 40, and another end of the rear cover 50 may make contact with the side plate 11. In addition, the length of the rear cover 50 in the vertical direction Z may be longer than the length of the protrusion part 17 in the vertical direction Z.

The rear cover 50 may be spaced apart from the protruding part 17 in the front-rear direction X. The front surface of the rear cover 50 may be spaced apart from the rear surface of the protruding part 17 in the front-rear direction X.

An inner cover 60 having a length shorter than the side cover 40 in the front-rear direction may be formed in the rear cover 50. The inner cover 60 may be parallel to the side cover 40. The inner cover 60 may protrude from the rear cover 50 toward the protruding part 17. The front end of the inner cover 60 may face the rear surface of the protruding part 17.

A gap T, in which the bending part 28 of the cable bracket 20, is received may be formed between the side cover 40 and the inner cover 60.

The bending part 28 may be bent to have an obtuse angle with respect to the fastening part 21, one end of the bending part 28 may be connected with the fastening part 21, and another end of the bending part 28 may face the inner cover 60.

Meanwhile, the bending part 28 may be formed in the cable bracket 20 such that the bending part 28 is surrounded by the side cover 40, the rear cover 50, the inner cover 60, and the protruding part 17.

Meanwhile, the display device may further include a magnet 70 to maintain the cover body 30 to the cable bracket 20. The magnet 70 may be coupled to the cover body 30.

When the stand 1 and the cover body 30 include a non-magnetic member, the cable bracket 20 may include a magnetic member, and the magnet 70 may be attached to the cable bracket 20 through magnetic force in the state that the magnet 70 is coupled to the cover body 30.

The magnet 70 may be fixed to a surface, which faces the cable receiving groove G, of opposite side surfaces of the cover body 30, and may be fixed to the surface, which faces the cable receiving groove G and the cable bracket 20, of opposite side surfaces of the side cover 40.

The magnet 70 may be fastened with a counter sunk screw, which is an example of a screw, formed on the cover body 30, and a portion of the magnet 70 is inserted into the cover body 30 such that that a magnetic receiving part 38 may protrude as a receiving part.

The magnet receiving part 38 may protrude to have a thickness thinner than that of the magnet 70. A portion, which is positioned outside the magnet receiving part 38, of the magnet 70 may be attached to the cable bracket 20 through magnetic force.

Hereinafter, an operation of storing the cable C will be described.

First, an operator may hold the cover body 30 and move the cover body 30 to the stand space S2. The cover body 30 may be separated from the cable bracket 20 together with the magnet 70, and the cable bracket 20 may be exposed.

The operator may moves a part of the cable C into the space between the side surface 15 of the cable receiving groove G and the spacing part 22 of the cable bracket 20, after putting a part of the cable C into the stand space S2, and inserting the cable C into the cable receiving groove G through the space between the front surface 14 of the cable receiving groove G and the front end 24 of the cable bracket 20. The cable C may be restricted from moving in the left-right direction Y by the spacing part 22 and the side plate 14, and may be restricted from moving in the rear direction by the protruding part 17.

As described above, after the part of the cable C is received between the side surface 15 of the cable receiving groove G and the spacing part 22, the operator positions the cover body 30 at the side of the cable receiving groove G. In this state, the operator may bring the cover body 30 into close contact with the cable bracket 20 such that the cover body 30 covers the cable receiving groove G. The magnet 70 mounted on the cover body 30 may be attached to the cable bracket 20 through magnetic force.

A portion of the outer circumference of the side cover 40 may be inserted and seated in a side cover receiving groove 16 formed on the side plate 11, the upper through hole P1 through which the cable C passes is formed between an upper end 51 of the rear cover 50 and the top surface 12 of the cable receiving groove G, and the lower through hole P2, through which the cable C passes, may be formed between the lower end 52 of the rear cover 50 and the bottom surface 13 of the cable receiving groove G.

When the attachment of the cover body 30 is completed as described above, the cable may be disposed to pass through the upper through hole P1, the space between the front surface 14 of the cable receiving groove G and the front end of the protruding part 17, and the lower through hole P2. This part may be received and protected by the stand module.

FIG. 12 is a perspective view when a cable bracket is fastened to a side plate and a cover body is separated according to another embodiment of the present disclosure, and FIG. 13 is a cross-sectional view when a cable bracket is fastened to a side plate and a cover body is attached to the cable bracket according to another embodiment of the present disclosure.

In this embodiment, a plurality of cable brackets 20A and 20B coupled to the side plate 11 may be provided, and the plurality of cable brackets 20A and 20B may include the first cable bracket 20A coupled to a protruding part 17', and a second cable bracket 20B coupled to a peripheral portion of the cable receiving groove G.

The first cable bracket 20A may be formed therein with a magnet receiving groove 21B to insert and receive the magnet 70.

The first cable bracket 20A may include a fastening part 21' coupled to the protruding part 17'. The fastening part 21' may include an upper fastening part 21B, a lower fastening part 21C, and a magnet attachment part 21D.

The upper fastening part 21B may be fastened to the protruding part 17' through a fastening member such as a screw.

The lower fastening part 21C may be spaced apart from the upper fastening part 21B in the vertical direction Z. The lower fastening part 21C may be fastened to the protruding part 17' through a fastening member such as a screw.

The magnet attachment part 21D may be a portion of the cable bracket 20 to receive the magnet 70, and to allow the magnet 70 to be attached thereto by magnetic force. The magnet attachment part 21D may be formed to be stepped from the upper fastening part 21B and the lower fastening part 21C.

Meanwhile, a recessed part 17G may be formed in the fastening part 17' to receive the magnet attachment part 21D.

The first cable bracket 20A may include a spacing part 22 spaced apart from the side surface 15 of the cable receiving groove G. The spacing part 22 of the first cable bracket 20A may have the same function as the spacing part 22 of the cable bracket 20 according to an embodiment of the present disclosure, and the details thereof will be omitted to avoid the redundant descriptions, below.

The second cable bracket 20B may include a fastening part 21" and a spacing part 22. The second cable bracket 20B may have a different fastening position from the cable bracket 20 according to an embodiment of the present disclosure. The fastening part 21" of the second cable bracket 20B may be fastened with a peripheral portion of the cable receiving groove G without being fastened the protruding part 17. For example, the fastening part 21" may be coupled to the side cover receiving groove 16 through a fastening member such as a screw. The spacing part 22 of the second cable bracket 20B may have the same function as the spacing part 22 of the cable bracket 20 of an embodiment of the present disclosure, and a detailed description thereof will be provided below to avoid redundant descriptions. Omit it.

The second cable bracket 20B may be spaced apart from the first cable bracket 20A. The second cable bracket 20B may form a gap P4' between the second cable bracket 20B and the first cable bracket 20A such that the cable C is introduced into the gap P4' from the side.

In the present embodiment, the stand 1, the cover body 30, and the magnet 70 other than the protruding part 17' and the first and second cable brackets 20A and 20B have the same as or similar to one embodiment of the present disclosure, so the same reference numerals are employed, and the details thereof will be omitted.

FIG. 14 is a perspective view when a cable bracket is fastened to a side plate and a cover body is separated according to another embodiment of the present disclosure.

In the present embodiment, a plurality of second cable brackets 20B' may be provided. Other components and operations other than the plurality of second cable brackets 20B' are the same as or similar to another embodiment of the present disclosure, so the same reference numerals are employed and the details thereof will be omitted.

Each of the plurality of second cable brackets 20B' may include a fastening part 21''' and a spacing part 22, which is the same as the second cable bracket 20B according to another embodiment of the present disclosure, and the number and the size of the second cable bracket 20B' may be different from those of the second cable bracket 20B according to another embodiment of the present disclosure.

The fastening part receiving part 16' may be formed on the side plate 11 to be recessed such that the fastening part receiving part 16' is stepped from the cover receiving groove 16. Each of a plurality of second cable brackets 20B' may be fastened with the fastening part receiving part 16' through a fastening member such as a screw.

The plurality of second cable brackets 20B' may be smaller in size than the second cable bracket 20B according to another embodiment of the present disclosure, and may be disposed to be spaced apart from each other.

The above description is merely illustrative of the technical spirit of the present disclosure, and those of ordinary skill in the technical field to which the present disclosure pertains may make various modifications and variations without departing from the essential characteristics of the present disclosure.

Accordingly, the embodiments disclosed in the present disclosure are not intended to limit the technical spirit of the present disclosure, but to explain the technical spirit, and the scope of the technical spirit of the present disclosure is not limited by these embodiments.

The scope of protection of the present disclosure should be interpreted by the claims below, and all technical spirits within the scope equivalent thereto should be construed as being included in the scope of the present disclosure.

What is claimed is:

1. A display device comprising:
   a stand comprising a side plate including a cable receiving groove formed to receive a cable;
   a cable bracket comprising a spacing part that is spaced apart from a surface of the cable receiving groove; and
   a cover body including a side cover to cover the cable receiving groove and the cable bracket, and a rear cover angled from the side cover;
   wherein the cable is received between the side surface of the cable receiving groove and the spacing part, and
   wherein the cable passes through an opening formed between a rear side of the rear cover and a rear side of the side plate.

2. The display device according to claim 1, wherein a magnet is coupled to the cover body.

3. The display device according to claim 1, wherein the cable receiving groove includes a top surface and a bottom surface,
   wherein an upper end of the rear cover is spaced apart from the top surface, and
   wherein a lower end of the rear cover is spaced apart from the bottom surface.

4. The electronic device according to claim 1, wherein the stand further comprises a side cover receiving groove which is formed at a peripheral portion of the cable receiving groove and is configured to receive a portion of the side cover.

5. The electronic device according to claim 1, wherein the cable receiving groove is defined by a top surface and a bottom surface, and a front surface connecting the front end of the top surface to a front end of the bottom surface, and
   wherein a protruding part is formed in the cable receiving groove to be spaced apart from the front surface toward a rear of the cable receiving groove.

6. The display device according to claim 5, wherein each of the top surface and the bottom surface includes:
   a first angled surface having a first obtuse angle with respect to the front surface, and
   a second angled surface extending from a rear end of the first angled surface, wherein an angle of the second angled surface with respect to the front surface is greater than the first obtuse angle.

7. The display device according to claim 5, wherein a top surface of the protruding part and a bottom surface of the protruding part are angled toward each other in a forward direction.

8. The display device according to claim 5, wherein the cable bracket is coupled to the protruding part,
   wherein a front end of the protruding part and the front surface are spaced apart from each other by a first distance, and
   wherein a front end of the cable bracket and the front surface are spaced apart from each other by a second distance shorter than the first distance.

9. The display device according to claim 5, wherein the rear cover is spaced apart from a rear of the protruding part,
   wherein the cover body further comprises an inner cover configured to protrude toward the protruding part,
   wherein a length of the inner cover is shorter than a length of the side cover, and
   wherein the cable bracket comprises a bent portion which is surrounded by the side cover, the rear cover, the inner cover, and the protruding part.

10. The display device according to claim 1, wherein side plate is one of a pair of side plates spaced apart from each other in a left-right direction, and
    wherein the cable receiving groove is formed at an inner side surface of at least one of the pair of side plates, and
    wherein inner side surfaces of each of the pair of side plates face each other.

* * * * *